(12) United States Patent
Hill

(10) Patent No.: US 8,502,484 B2
(45) Date of Patent: Aug. 6, 2013

(54) POWER STAGE FOR DRIVING AN ELECTRIC MACHINE

(76) Inventor: Wolfgang Hill, Karlsruhe (DE)

( * ) Notice: Subject to any disclaimer, the term of this patent is extended or adjusted under 35 U.S.C. 154(b) by 1097 days.

(21) Appl. No.: 10/818,520

(22) Filed: Apr. 6, 2004

(65) Prior Publication Data
US 2004/0195985 A1 Oct. 7, 2004

(51) Int. Cl.
*H02M 7/537* (2006.01)
*H02M 1/00* (2007.01)

(52) U.S. Cl.
USPC ........... 318/293; 318/280; 363/132; 363/147; 361/18

(58) Field of Classification Search
USPC ................ 318/254, 701, 705, 678, 686, 280, 318/287, 291, 293, 294; 363/136, 123, 131, 363/132, 144, 147; 326/101–103; 361/18
See application file for complete search history.

(56) References Cited

U.S. PATENT DOCUMENTS

| 4,183,037 | A | * | 1/1980 | Le Can et al. | 257/776 |
|---|---|---|---|---|---|
| 4,218,694 | A | * | 8/1980 | Grzybowski | 257/705 |
| 4,458,305 | A | * | 7/1984 | Buckle et al. | 363/141 |
| 5,159,515 | A | * | 10/1992 | Fishbein | 361/18 |
| 5,172,310 | A | * | 12/1992 | Deam et al. | 363/144 |
| 5,579,217 | A | * | 11/1996 | Deam et al. | 363/144 |
| 5,671,134 | A | * | 9/1997 | Nomura et al. | 363/132 |
| 5,748,179 | A | * | 5/1998 | Ito et al. | 349/152 |
| 5,843,841 | A | * | 12/1998 | Izawa et al. | 438/666 |
| 6,212,087 | B1 | * | 4/2001 | Grant et al. | 363/144 |
| 6,426,650 | B1 | * | 7/2002 | Dufour et al. | 326/47 |
| 6,462,583 | B2 | * | 10/2002 | Aksamit | 326/103 |
| 6,646,331 | B2 | * | 11/2003 | Sakamoto et al. | 257/678 |
| 6,831,294 | B1 | * | 12/2004 | Nishimura et al. | 257/48 |
| 6,835,971 | B2 | * | 12/2004 | Toyoshima et al. | 257/207 |
| 6,847,120 | B2 | * | 1/2005 | Ohno | 257/778 |
| 6,873,045 | B2 | * | 3/2005 | Yoshizaki et al. | 257/735 |
| 6,911,392 | B2 | * | 6/2005 | Bieck et al. | 438/667 |
| 2001/0050421 | A1 | * | 12/2001 | Kono | 257/676 |

* cited by examiner

*Primary Examiner* — Bentsu Ro

(57) ABSTRACT

A power stage for driving an electric machine comprising at least two semiconductor switches designed as semiconductor chips, which are connected by at least one bridge conductor to form a half bridge. The semiconductor switches area contact with each one of their contact surfaces an electric conductor track. The conductor tracks and the at least one bridge conductor are connected to the electric connection terminals for the machine and/or the power supply. The at least one bridge conductor is designed as conductor element which is arranged in at least one plane which is partially disposed approximately parallel to the extension plane of at least one of the conductor tracks. The at least one bridge conductor area contacts the semiconductor switches at a second contact surface which is disposed opposite the first contact surface which is connected to one of the conductor tracks.

18 Claims, 6 Drawing Sheets

POWER STAGE FOR DRIVING AN ELECTRIC MACHINE

BACKGROUND OF THE INVENTION

1. Field of the Invention

The invention concerns a power stage for driving an electric machine.

2. Description of Prior Art

A power stage for driving a brushless electric motor is known in the field. It comprises several semiconductor switches designed as transistor chips, of which two each are joined by bond wires and conductor tracks to form a half bridge. The semiconductor switches are arranged on a printed circuit board comprising an electrically insulating substrate, onto the surface of which that is facing the semiconductor switches conductor tracks of copper are deposited. The semiconductor switches have on their front and rear faces electric contact areas which, on the rear face of the semiconductor switch facing the circuit board, are connected to the conductor track. To each contact area on the front face of the semiconductor switches bond wires are attached by ultrasonic welding. The outer edges of the circuit board are surrounded by a frame which comprises the electric input and output terminals for connection to a motor winding and/or a power supply. These input and output terminals are connected to the conductor tracks of the circuit board by bond wires. The bond wires have a diameter of approx. 0.3~0.5 mm and therefore a relatively large ohmic resistance which can reach more than 1 mΩ. Thus, the electric resistance of the bond wires lies in the approximate range of a low resistance semiconductor switch, i.e. the bond wires contribute already up to 50% to the total resistance of the power stage. This is unfavorable, particularly for driving of electric motors which require a relatively high motor current, from which follows the requirement that the motor circuit and thus the power stage is to be designed for as low resistance as possible.

Another disadvantage of the power stage is the need of the bond wires for large space on the circuit board, since they, besides the semiconductor switches, require a contact surface . The circuit board surface of the power stage amounts to a multiple of the chip surface of the semiconductor switch. Therefore, a relatively large amount of conductor and insulation material is required for the production of power stages, which increases costs. In addition to this, the costs for the bond wires has to be considered. Finally, ultrasonic welding can not always guarantee a secure contact of the bond wires with the conductor tracks, respectively the semiconductor switches.

Therefore, the objective of this invention is to create a power stage of the above indicated type which provides low impedance and high operational reliability. Furthermore, the output performer should have compact dimensions and its production should be cost effective.

SUMMARY OF THE INVENTION

This objective is achieved by the characteristics of claim 1. Accordingly, in an advantageous embodiment, the semiconductor switches which are designed as housingless semiconductor chips, are contacted on both sides by conductor elements. This makes it possible to conduct electric current at the transition areas between the semiconductor switches and the conducting material, as well as on both sides of the semiconductor switches in the conducting material of at least one of the bridge conductors and of the conductor tracks in a relatively large cross section, so that, overall, a lower ohmic resistance and corresponding low thermal power losses in the power stage is the result. In addition, compared to a power stage in which contacting of the semiconductor switches occurs by means of bonding wires, a considerably more compact construction of the power stage of the present invention is possible, since contact locations for the bond wires adjacent to the semiconductor chips are not needed. The connection between the bridge conductors and the conductor tracks on the one hand and the semiconductor switches on the other can be realized by a soldered or adhesive layer made of an electrically conductive material. The contacting of the semiconductor switches on both sides achieves great contact reliability and, thus, operational reliability of the power stage.

In an advantageous embodiment of the invention, the conductor tracks are arranged in the same plane, preferably parallel to each other. The parallel arrangement of the conductor tracks provides an even more compact construction of the power stage, in which the base area required for the conductor tracks needs to be only slightly larger than the sum of the base areas of the semiconductor switches.

An even smaller base area of the power stage can be achieved by providing a parallel interspace between the extension planes of the conductor tracks, and that the plane in which the at least one bridge conductor is arranged, is disposed between these extension planes. This results in a stack of layers in which the semiconductor switches, the conductor tracks, and the bridge conductors are arranged in at least five layers on top of each other. This extremely compact design is particularly well suited for power stages of motor operators which have short on-times. Due to the large conductor cross sections, thermal power losses are largely determined by the semiconductor switches, for which preferably semiconductor switches with lowest possible resistance are utilized, in order to guarantee still sufficient on-transition times in even high ambient temperatures.

In an effective embodiment of the invention, the power stage comprises at least two half bridges which have each a first semiconductor switch and a second semiconductor switch. The two semiconductor switches are connected with each other by a bridge conductor which is designed as a prefabricated conductor element and which area contacts the second contact surface of these semiconductor switches in such a manner that the bridge conductors of the half bridges are arranged side by side and that the first contact surfaces of the first semiconductor switches area contact a first conductor track which extends continuously across the first semiconductor switches, and the first contact surfaces of the second semiconductor switches area contact a second conductor track which extends continuously across the second semiconductor switches. Several half bridges at a time are supplied with current via the conductor tracks continuously extended across the semiconductor switches, which allows for an even more compact design of the power stage.

It is advantageous if the bridge conductors are arranged parallel to each other in their extension plane. The bridge conductors are arranged transverse, preferably at a right angle to the conductor tracks.

In an advantageous embodiment of the invention the conductor tracks and/or the bridge conductors are arranged as a layer on at least one electrically insulating substrate plate, like a DCB board or a lead frame on a film.

In an advantageous embodiment of the invention, the conductor tracks and/or the bridge conductors are arranged on at least one metallic heat sink plate in which an electrically insulating intermediate layer is to be inserted between the heat sink plate and the conductor tracks and/or bridge conductors. The heat sink plate allows for large surface heat elimination via the intermediate layer from the semiconductor switches to e.g. a mounting device connected to the heat sink plate. The intermediate layer can be a thermal conducting insulating material, particularly a double-sided adhesive film.

It is advantageous, if the conductor tracks and/or the bridge conductors are designed as plates and if in the transverse direction to the extension plane of the conductor tracks the thickness of the conductor tracks is larger than the thickness of the semiconductor switches. The conductor tracks and/or the bridge conductors are designed as solid, relatively thick plates, preferably of copper. This provides the conductor tracks and/or bridge conductors with sufficient thermal capacity to buffer power loss spikes in cyclic operation.

In an advantageous embodiment of the invention, in the extension plane of at least one semiconductor switch and adjacent to the same, a polarity protection component and/or a current measuring shunt is arranged which, with its one contact surface is area connected to a conductor track and with its other, oppositely disposed side, is area connected to at least one input or output conductor which is approximately arranged in the extension plane of the bridge conductors. In this space-saving manner, the polarity protection component and/or the current measuring shunt are integrated into the power stage.

It is advantageous, if the current measuring shunt is connected with its one end to a conductor track or a bridge conductor and with its other end to a connecting conductor, and that the connecting area at which the conductor track or the bridge conductor is contacting the current measuring shunt and the connecting area at which the connecting conductor is contacting the current measuring shunt are distanced from each other transverse to the extension plane of the conductor track or the bridge conductor. Thus, the current measuring shunt is arranged between two conductor planes. This results in a space-saving arrangement of the current measuring shunt, in which the current conduction in the current measuring shunt occurs transverse and preferably at a right angle to the extension plane of the conductor track, respectively the bridge conductor. Separate conductor parts at the current measuring shunt are not required, but the current measuring shunt can be made up during production of the power stage by separating it from a plate or strip. As tap of the signal voltage at the current measuring shunt, contact brackets can be provided, preferably at the currentless end of the conductor track, the bridge conductor, and/or the connecting conductor.

Onto the stack of layers comprising the conductor tracks, the semiconductor switches, and at least one bridge conductor, a control logic may be arranged as an additional layer, with its extension plane approximately parallel to the planes of the stacked layers, in which this control logic is connected to control inputs of the semiconductor switches by conductor parts which are arranged transversely to the planes of the stacked layers. The control logic comprises preferably a multilayered thick layer substrate, but may, for low operating temperature applications, be executed as a multilayer board. The conductor parts for transmission of current and/or temperature signals for the semiconductor switches may be designed as pins or clips. Due to the short paths which have to be bridged by the conductor parts, good and interference-free signal transmission even at large currents in the power track, will be enabled.

Advantageously, the semiconductor switches, the polarity protection component and/or the current measuring shunt are preferably surrounded by a frame-like electrically insulated housing part, in which the conductor tracks, bridge conductors, input conductors and/or output conductors, in order to provide electric connection contacts, are freely exposed in areas of the housing part and/or are protruding from the outer circumference of the same. Electric current in the power track can then be transmitted directly from the semiconductor components to the electric connection terminals for the machine and/or the power supply.

It is advantageous, if at least one conductor track and/or at least one bridge conductor comprises a deformed section between the electric connection terminals for the machine and/or the power supply and a semiconductor switch. Mechanical forces acting on the conductor tracks and/or bridge conductors at the connection terminals are thus uncoupled by the deformed sections from the part of the conductor track, respectively the bridge conductor connected to the semiconductor switch.

It is advantageous, if the control logic comprises a semiconductor component into which a signal processing device is integrated. This semiconductor component is preferably designed as mixed signal ASIC in flip-chip technology and arranged on a multilayer thick ceramic or multilayer board. The design of the power stage is then even more compact. The semiconductor component can comprise a measuring signal input for a rotation and/or position measuring signal and/or for winding voltages of the electric machine, as well as outputs for triggering the semiconductor switch. The signal processing device can be designed to determine at least one state variable of the electric machine and/or to limit a physical value of the electric machine, such as temperature, winding current, rotation, position and/or acceleration. At least one driver and/or a voltage supply for an electric circuit may be integrated into the semiconductor component.

BRIEF DESCRIPTION OF THE DRAWINGS

Below, the drawings of execution examples of the invention are described in more detail. Shown are.

DETAILED DESCRIPTION OF THE PREFERRED EMBODIMENT

A power stage for driving a brushless electric motor, denoted in its entirety as 1, comprises several semiconductor switches 2a, 2b designed as housingless semiconductor chips, of which two each are connected by a bridge conductor 3 to form a half bridge.

Figure 1:
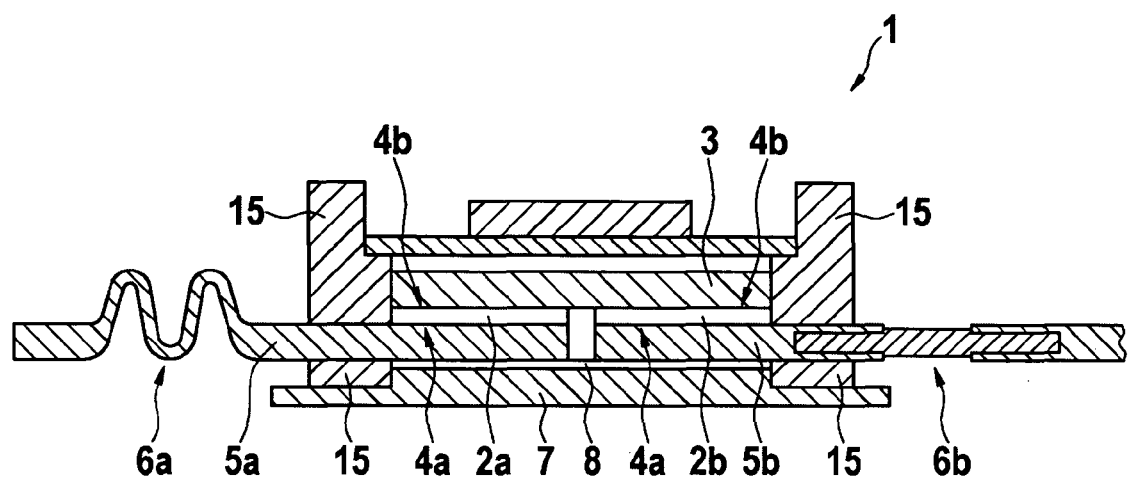
FIG. 1 A cross section through a power stage with a half bridge comprising a semiconductor switch for driving an electric machine.

As can be clearly seen in FIG. 1, the semiconductor switches 2a, 2b are electrically contacted by conductor material at contact surfaces 4a, 4b which are oppositely disposed facing away from each other. A first semiconductor switch 2a of each half bridge is area connected to a first contact surface 4a with a first conductor track 5a which can be connected, e.g., to the positive pole or the high side of an electric power supply. The first conductor track is designed as a plane conductor element, the extension plane of which is arranged approximately parallel to the extension planes of the semiconductor switches 2a, 2b.

On its second contact surface 4b which is disposed opposite facing away from the first contact surface 4a, the first semiconductor switches 2a is connected to a bridge conductor 3, which is connected to a connection or a phase of a motor winding. The bridge conductors 3 is also designed as plane conductor elements and arranged adjacent in a plane which is disposed approximately parallel to the extension planes of the semiconductor switches 2a, 2b.

The bridge conductors 3, is connected to a second contact surface 4b of a second semiconductor switch 2b of the respective half bridge. The second semiconductor switches 2b is arranged in the plane of the first semiconductor switches 2a adjacent to the same.

Figure 2:
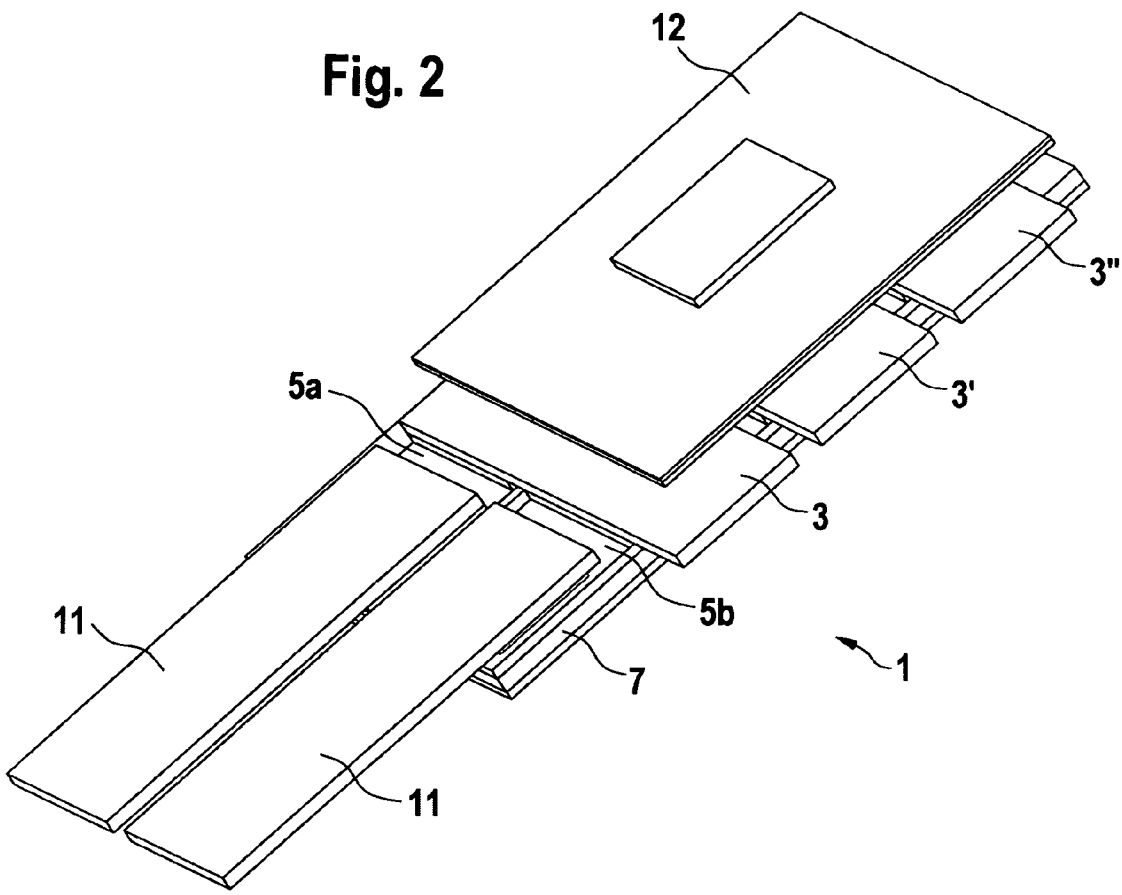
FIG. 2 View of a power stage, in which the semiconductor switches and the conductors contacting the same are arranged in three stacked planes, and which shows in an additional plane a control logic for the semiconductor switches.

On a first contact surface 4a which is disposed opposite facing away from the second contact surface 4b, the second semiconductor switches 2b is connected to a second conductor track 5b which, e.g., may be connected to the negative pole or the low side of the electric power supply. The second conductor track 5b is designed as plane conductor element which in the execution examples in accordance with FIGS. 1 and 2 is disposed approximately in the plane of the first conductor track 5a adjacent to the same. In FIG. 1 it can be seen that the conductor tracks 5a, 5b comprise a flexible zone 6a, 6b in order to avoid coupling of mechanical forces, in which zone 6a is designed as a wave-shaped conductor track section and zone 6b as a piece of stranded wire.

A heat sink plate 7 can be arranged on a housing part 15 designed as a module frame which is made of an electric insulating material of high thermal conductibility and which is connected to the heat sink plate 7. The heat sink plate 7, e.g. a cooling plate with a thermoconducting and electrically insulating coating, is arranged as an intermediate layer 8 between the heat sink plate 7 and the conductor tracks 5a, 5b. The heat sink plate 7 may protrude somewhat beyond the edge of the housing part 15, thus providing handling surfaces for assembly and, if needed, by appropriate design, a good seal when spray-coating with synthetic material.

Figure 3:
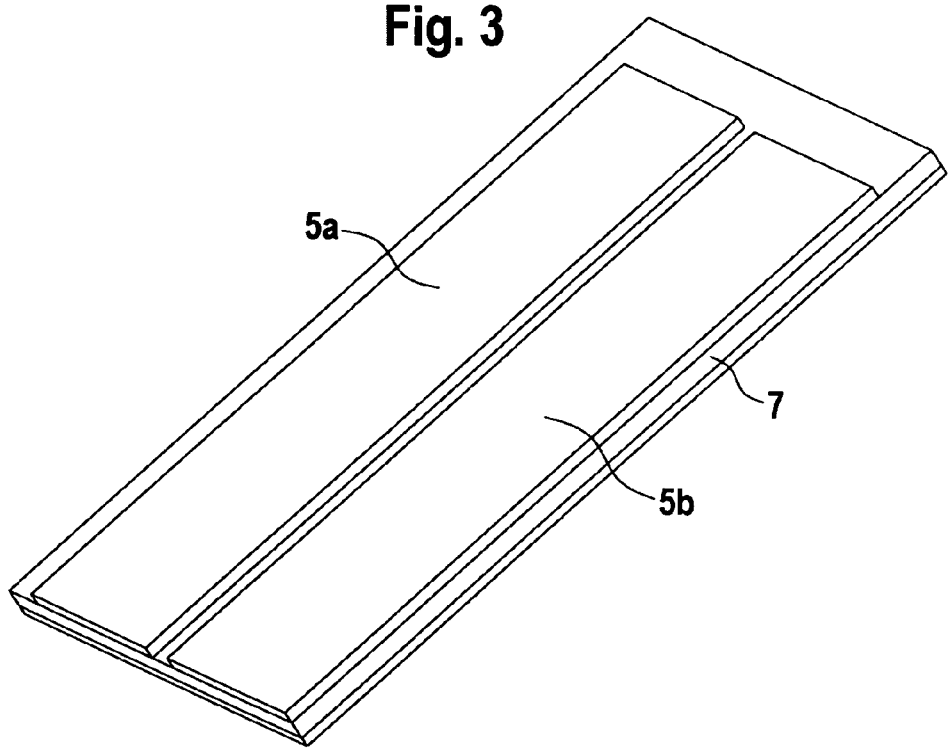
FIGS. 3–5 Process steps to be executed when assembling the power stage shown in FIG. 2.

The process steps of producing the power stage 1 are shown in FIGS. 2 to 5. First, two straight strip-shaped conductor tracks 5a, 5b are arranged on a base plate in such a manner that they are disposed approximately parallel to each other with a lateral interspace between them (FIG. 3). The base plate may consist of a heat sink plate 7.

Figure 4:
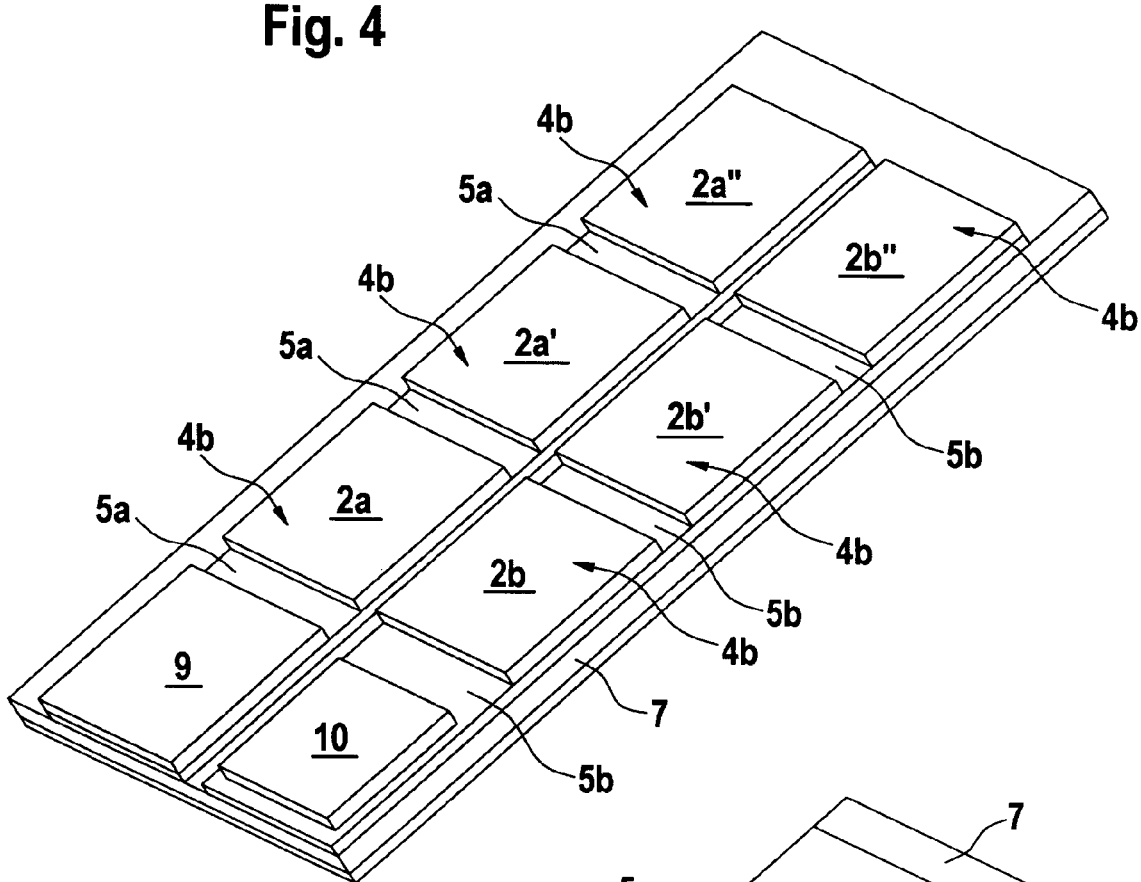

In a next step, as shown in FIG. 4, the semiconductor switches 2a, 2a', 2a", 2b, 2b', 2b" are mounted on the conductor tracks 5a, 5b in two adjacent rows along the same in such a manner that the first semiconductor switches 2a, 2a', 2a" of the half bridges are contacting the first conductor track 5a and the second semiconductor switches 2b, 2b', 2b" are contacting the second conductor track 5b. In addition, a polarity protection component 9 is contacted to the one conductor track 5a, 5b and/or a current measuring shunt 10 is contacted to the other conductor track 5b, 5a. In FIG. 4 it can bee seen that the polarity protection component 9 and the current measuring shunt 10 are arranged in the plane of the semiconductor switches 2a, 2a', 2a", 2b, 2b', 2b" adjacent to the same.

Figure 5:
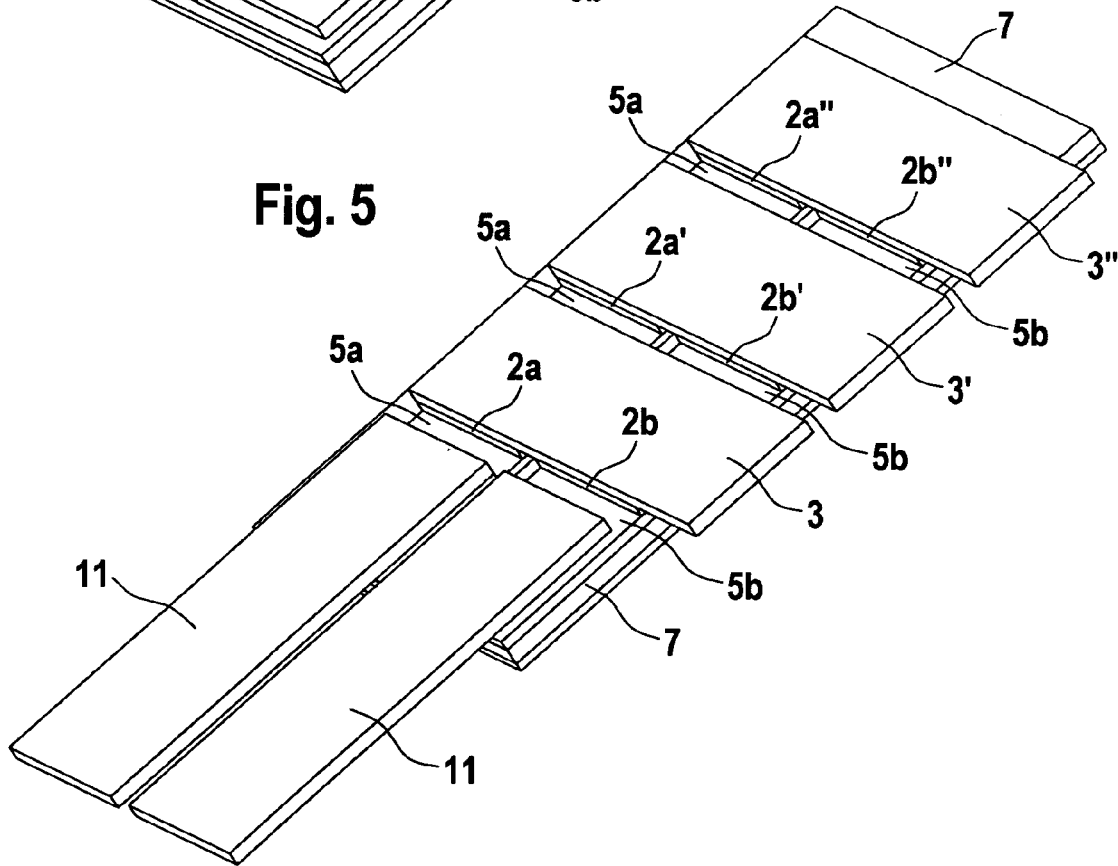

In another plane which is disposed parallel to the plane of the conductor tracks 5a, 5b, the strip-shaped bridge conductors 3, 3', 3" are mounted on the second contact surfaces 4b of the semiconductor switches 2a, 2a', 2a", 2b, 2b', 2b". In FIG. 5 it can bee seen that the bridge conductors 3, 3', 3" are arranged parallel to each other and transverse to the longitudinal extension of the conductor tracks 5a, 5b. In addition, an input conductor, respectively an output conductor is contacted onto the polarity protection component 9 and the current measuring shunt 10. The input and output conductors 11 are arranged in approximately the plane of the bridge conductors 3, 3', 3" and are disposed transverse to the same in the direction of the conductor tracks 5a, 5b. The connection of the semiconductor switches 2a, 2a', 2a", 2b, 2b', 2b" with the conductor tracks 5a, 5b and the bridge conductors 3, 3', 3" may be accomplished by soldering or glueing with electrically conductive materials or other joining methods. The conductor tracks 5a, 5b and the bridge conductors 3, 3', 3" are made of solid copper plate which are of a larger thickness than the semiconductor switches 2a, 2a', 2a", 2b, 2b', 2b".

In a further step, a logic plate (12) is mounted as control logic on the surface of the bridge conductors 3, 3', 3" which is disposed opposite and facing away from the semiconductor switches 2a, 2a', 2a", 2b, 2b', 2b" and which is arranged approximately parallel to the plane of the semiconductor switches 2a, 2a', 2a", 2b, 2b', 2b". On logic plate 12 an ASIC is arranged which integrates in itself all logic functions of the power stage. In addition, merely a few passive components (condensers, resistors) are placed on the logic plate 12, so that the same is of very compact construction. For triggering the semiconductor switches 2a, 2a', 2a", 2b, 2b', 2b" the control logic is connected via conductor parts 13 which are oriented transverse to the plane of the semiconductor switches 2a, 2a', 2a", 2b, 2b', 2b" to control inputs of the semiconductor switches 2a, 2a', 2a", 2b, 2b', 2b" which are not detailed in the drawing. In the execution example in accordance with FIG. 2, the conductor parts 13 are designed as pins, and in the execution example in accordance with FIGS. 6 and 7, they are designed as clips.

Figure 6:
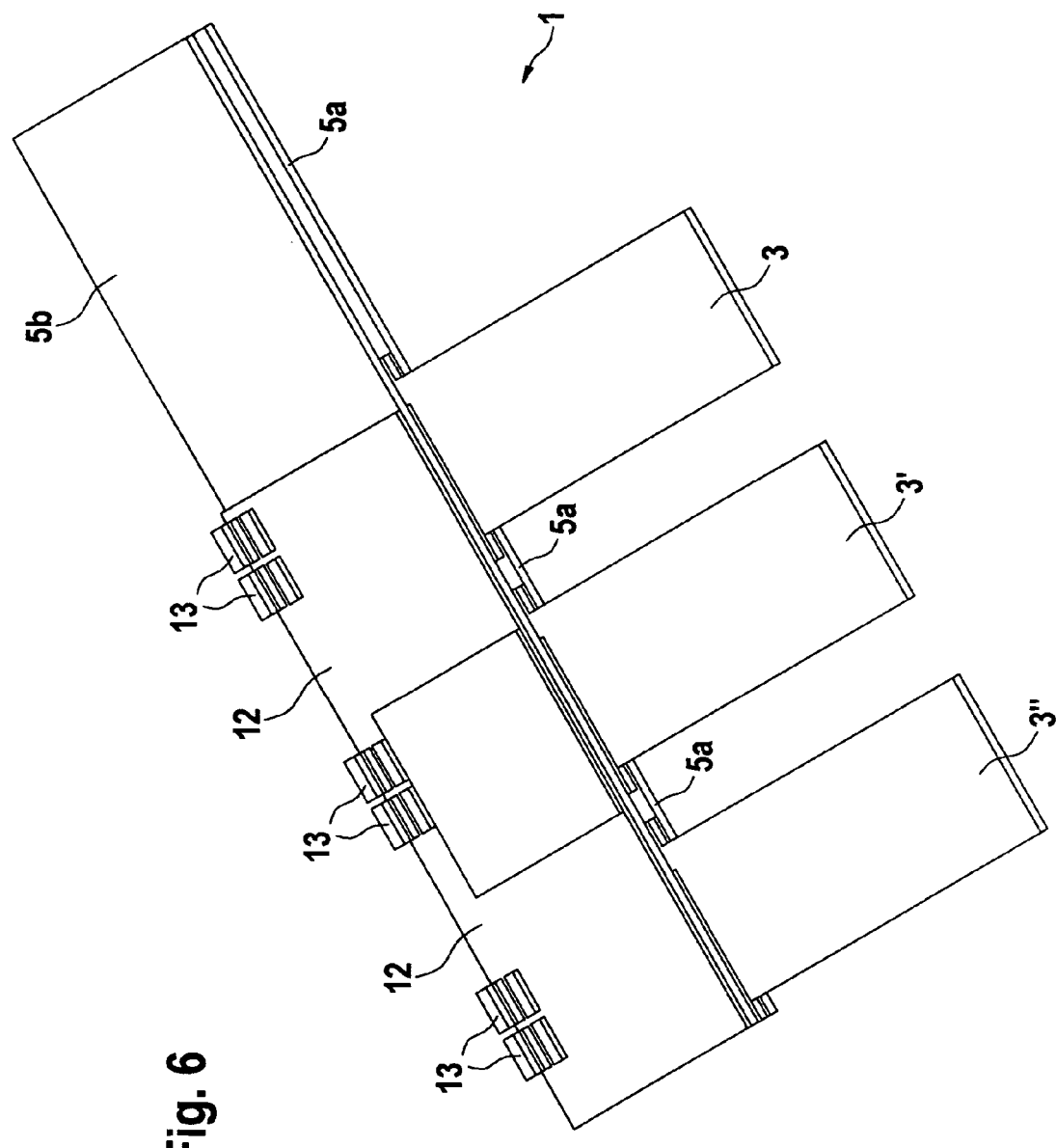
FIG. 6 View of a power stage in which the semiconductor switches and the conductors contacting the same are arranged in five stacked planes, and which shows in an additional plane a control logic for the semiconductor switches.
Figure 7:
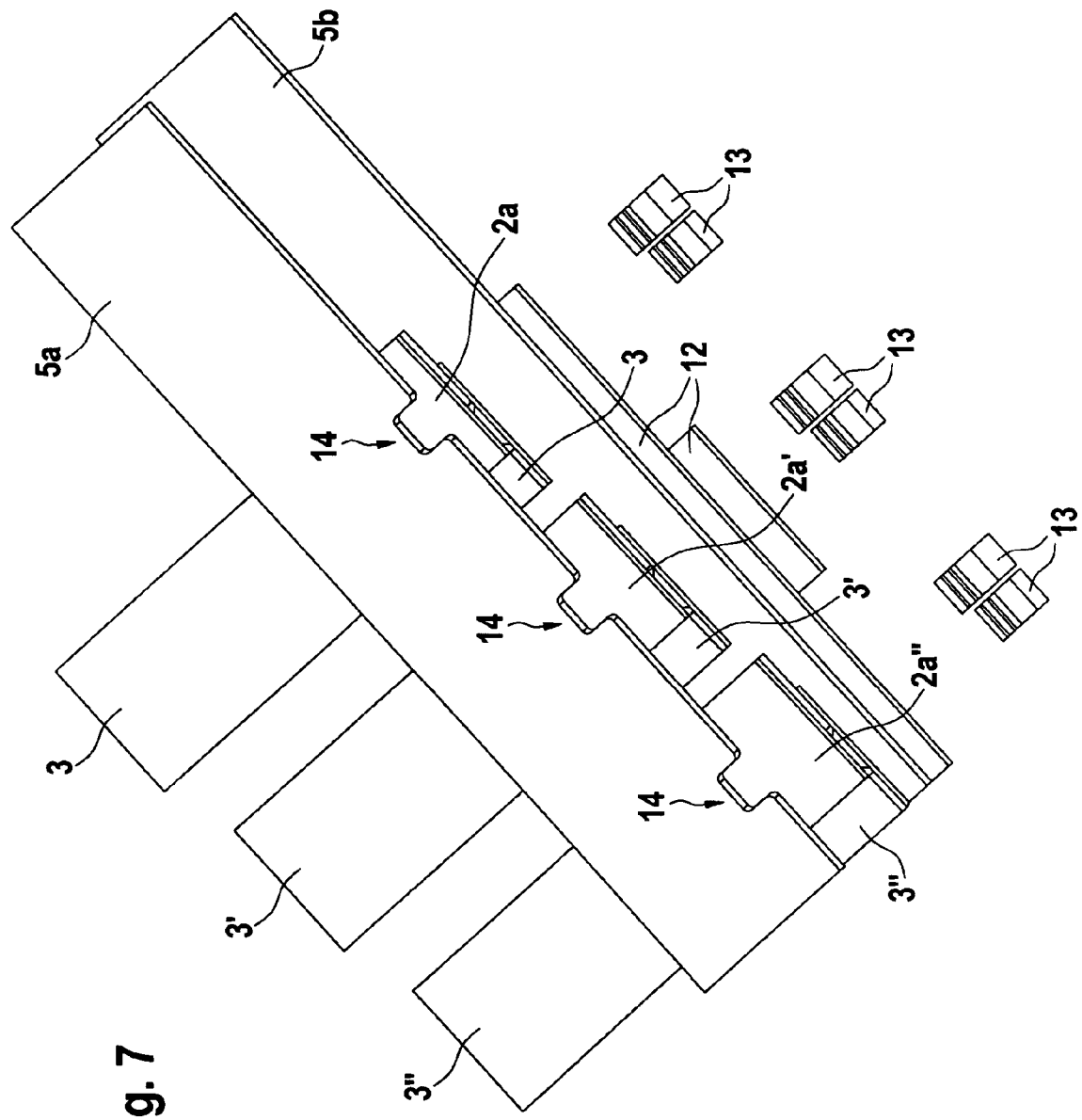
FIG. 7 An exploded view of the power stage shown in FIG. 6.

In the especially compact design of the execution example in accordance with FIGS. 6 and 7, the conductor tracks 5a, 5b are arranged in different planes, in which the first semiconductor switches 2a, 2a', 2a" and the second semiconductor switches 2b, 2b', 2b" as well as the bridge conductors 3, 3', 3" are disposed between the planes. Thus, the power section of the power stage 1 consists of a design with five planes—three conductor planes and two semiconductor planes, in which the conductor planes and the semiconductor planes alternate transverse to the extension direction of the layers. To allow for the passage of the clip-shaped conductor parts 13 which are connected to the control inputs of the semiconductor switches 2a, 2a', 2a", 2b, 2b', 2b", the bridge conductors 3, 3', 3" and the second conductor track 5b have recesses 14 in an edge area in which this edge area is disposed opposite the side at which the bridge conductors 3, 3', 3" protrude laterally from the layered stack. The clip-shaped conductor parts 13 are designed in an approximate U-shape and press with one of their U-legs against a control input (e.g. a gate contact) of a semiconductor switch 2a, 2a', 2a", 2b, 2b', 2b" and with their other U-leg against a contact point on the logic plate 12. Based on the multilayered design, the three half bridges shown in FIGS. 6 and 7 for a brushless three-phase motor requires a base area smaller than the sum of the six semiconductor switches 2a, 2a', 2a", 2b, 2b', 2b". Cooling of the semiconductor switches 2a, 2a', 2a", 2b, 2b', 2b" occurs via the free surface of the second conductor track 5b as well as the contact surfaces of the conductor tracks 5a, 5b and the bridge conductors 3, 3', 3" with a module frame. Additionally, a direct contact of a heat sink with the logic plate 12 may be provided. In order to avoid coupling of mechanical forces, the bridge conductors 3, 3', 3" change into a flexible zone which can be realized, e.g. by joining the bridge conductors 3, 3', 3" with a stranded wire or conductor elements which has a soft deformation zone. This can be made from a combined cutting and bending piece by punching and bending while producing the power stage.

Figure 8:
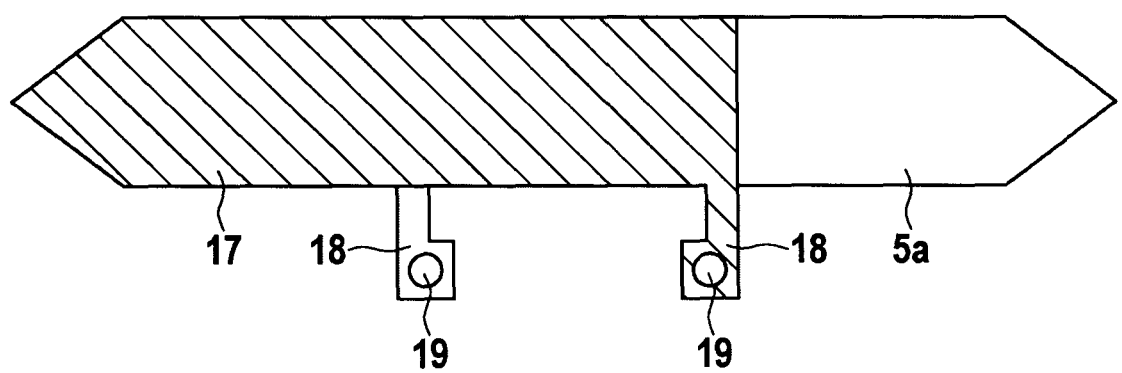
FIG. 8 A top view of a conductor layer and a connecting conductor with a current measuring shunt arranged between them, in which the conductor track and the connecting conductor are only partially shown.
Figure 9:
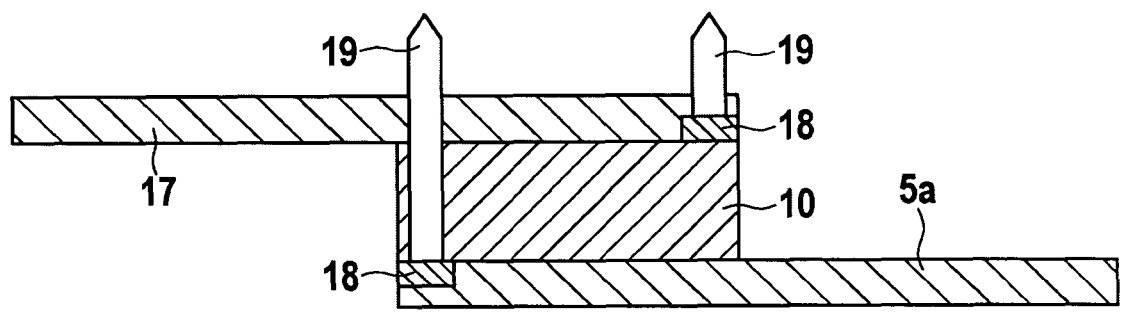
FIG. 9 A lateral view of the measuring arrangement shown in FIG. 8.

In FIGS. 8 and 9 it can be seen that the current measuring shunt 10 is connected at one of its ends to a conductor track 5a, 5b, and at its other end to a connection conductor 17. The connection conductor 17 is arranged on a plane approximately parallel to the plane of the conductor tracks 5a, 5b from which it is separated by a distance. The current measuring shunt 10 is arranged between these planes, contacting with its one end to the conductor track 5a, 5b and with its other to the connecting conductor 17. Current conduction in the current measuring shunt 10 occurs transverse to the plane of the conductor track 5a, 5b and the plane of the connection conductor 17.

As tap of the electric signal voltage, contact brackets 18 which carry contact pins are attached to the nearly currentless ends of the conductor tracks 5a, 5b and the connection conductor 17. In FIG. 9 it can be seen that the contact brackets 18 are of a lesser thickness transverse to the planes of the conductor tracks 5a, 5b and the connection conductor 17 than the conductor tracks 5a, 5b and the connection conductor 17 themselves. The contact pins 19 engage the holes in the contact brackets. The contact brackets can be made by a stamping and/or punching process.

The execution examples are not to be understood as a restriction of the invention. Rather, numerous variations and modifications within the framework of the present disclosure are possible.

The invention claimed is:

1. Power stage for driving an electric machine or a power supply, wherein said power stage comprises at least two metallic conductor parts and at least two discrete active semiconductor power switches which are designed as housingless semiconductor chips that are triggered by a control logic, said discrete active semiconductor power switches being connected to each other by at least one metallic bridge conductor which is an discrete metallic conductor part, thereby forming a half bridge of said power stage, in which said discrete active semiconductor power switches are area-contacting with a first of their contact surfaces one of said discrete metallic conductor parts, and in which at least one of said bridge conductors is connected to an electric terminal of said power stage, said at least one bridge conductor is area-contacting at least one said discrete active semiconductor power switches at a second contact surface which is disposed oppositely to said first contact surface connected with one of said discrete conductor parts, said conductor parts or said bridge conductors are designed as solid plates and said discrete active semiconductor power switches and said conductors contacting the same are arranged in three stacked plane layers.

2. Power stage in accordance with claim 1, wherein said conductor parts are preferably arranged parallel to each other in a first plane layer and in which at least one of said bridge conductors is designed as a planiform conductor element which is arranged in a plane layer approximately parallel to said plane layer of said at least two conductor parts.

3. Power stage in accordance with claim 1, wherein said power stage comprises at least two said half bridges which have each a first said active semiconductor switch and a second said active semiconductor switch which have each a first contact surface and a second contact surface, said first and said second active semiconductor switch being connected with each other by a bridge conductor which is designed as a conductor element and which is area-contacting said second contact surfaces of said active semiconductor switches in such a manner that the bridge conductors of the half bridges are arranged side by side in a plane, said discrete metallic conductor parts form conductor tracks and wherein said first contact surfaces of said first active semiconductor switches are connecting with a first said conductor track which extends continuously across the said first active semiconductor switches, and said first contact surfaces of said second active semiconductor switches are connecting with a second said conductor track which extends continuously across the said second active semiconductor switches.

4. Power stage in accordance with claim 1, wherein at least two of said bridge conductors are arranged parallel to each other in a plane.

5. Power stage in accordance with claim 1, wherein said conductor parts or said bridge conductors are arranged as a coating on at least one electrically insulated substrate plate.

6. Power stage in accordance with claim 1, wherein said conductor parts or said bridge conductors are arranged on at least one metallic heat sink plate, and wherein an electrically insulating intermediate layer is provided between said heat sink plate and said conductor parts or said bridge conductors.

7. Power stage in accordance with claim 1, wherein said conductor parts or said bridge conductors are designed as solid metallic plates, and wherein the thickness of said conductor parts in a transverse direction to a plane parallel to said first contact surface of said conductor parts is larger than the thickness of said active semiconductor switches.

8. Power stage in accordance with claim 1, wherein in a plane adjacent to at least one said semiconductor switches is arranged a polarity protection component or a current measuring shunt, said polarity protection component or current measuring shunt being area-connected on its one contact surface to said conductor track and on its oppositely disposed other contact surface to at least one input conductor or output conductor, said input conductor or output conductor being arranged approximately in a plane of said bridge conductor parallel to said first contact surface.

9. Power stage in accordance with claim 1, wherein at least one of said discrete metallic conductor parts form a conductor track and in a plane adjacent to at least one of said active semiconductor switches is arranged a current measuring shunt with a first and a second end, said first end of said current measuring shunt is connected at a first connecting area to said conductor track or said bridge conductor and said second end of said current measuring shunt is connected at a second connecting area to a connecting conductor, and said first connecting area and said second connecting area are separated by a distance perpendicular to said plane parallel to said first contact surface.

10. Power stage in accordance with claim 1, wherein in a plane adjacent to at least one of said active semiconductor switches is arranged a polarity protection component or a current measuring shunt, said at least one active semiconductor switch and said polarity protection component or said current measuring shunt are enclosed preferably by an electrically insulated housing part and are connected to at least one input conductor or output conductor, and wherein said conductor parts, said bridge conductors, and said at least one input conductor or output conductor, in order to provide electric connection terminals, are freely exposed in areas of said electrically insulated housing part or are protruding from the outer circumference of said electrically insulated housing part.

11. Power stage in accordance with claim 1, wherein at least one said discrete metallic conductor part form a conductor track and said conductor track or at least one said bridge conductor or at least one input conductor or output conductor form a connection between an active semiconductor switch or a current measuring shunt and an electric machine or a power supply, and wherein at least one said conductor part or at least one said bridge conductor or at least one of said input conductors or said output conductors comprises a deformed section between a first electric connection area to said electric machine or said power supply and a second electric connection area to one said active semiconductor switch or a current measuring shunt.

12. Power stage in accordance with claim 1, wherein said conductor parts and said bridge conductors are arranged on at least one metallic heat sink plate, and wherein an electrically insulating intermediate layer is provided between said heat sink plate and said conductor parts and said bridge conductors.

13. Power stage in accordance with claim 1, wherein said conductor parts and said bridge conductors are designed as solid metallic plates, and wherein the thickness of said conductor parts and said bridge conductors in a transverse direction to a plane parallel to said first contact surface of said conductor parts is larger than the thickness of said active semiconductor switches.

14. Power stage for driving an electric machine or a power supply, wherein said power stage comprises at least two discrete metallic conductor parts and at least two discrete semiconductor power switches which are designed as housingless semiconductor chips, said discrete semiconductor power switches being connected to each other by at least one metallic bridge conductor which is a discrete metallic conductor part, thereby forming a half bridge of said power stage, in which said discrete semiconductor power switches are area-contacting with a first of their contact surfaces one of said discrete metallic conductor parts, and in which at least one of said bridge conductors is connected to an electric terminal of said power stage, said at least one bridge conductor is area-contacting at least two said discrete semiconductor power switches at a second contact surface which is disposed oppositely to said first contact surface connected with one of said conductor parts and said conductor parts are arranged in a first plane and in a second plane, said planes are parallel and separated from each other by a distance, said at least one bridge conductor is arranged in a third plane, said third plane is disposed between said first and second planes, said conductor parts or said bridge conductors are designed as solid plates and said discrete semiconductor power switches, said conductor parts and said bridge conductors are arranged in at least five layers on top of each other.

15. Power stage for driving an electric machine, specifically a brushless electric motor, in which said power stage comprises at least two semiconductor switches which are designed as semiconductor chips, said semiconductor switches being connected to each other by at least one bridge conductor thereby forming a half bridge, in which said semiconductor switches are area-contacting with one of their contact surfaces an electric conductor track, and in which said conductor tracks and at least one of said bridge conductors are connected to electric terminals for the machine and/or a power supply, wherein said at least one bridge conductor is area-contacting said semiconductor switches at a second contact surface which is disposed oppositely to said first contact surface connected with one of said conductor tracks, wherein said conductor parts, said active semiconductor switches, and said at least one bridge conductor form a stack of layers, onto said stack of layers is placed as an additional layer a control logic, said stack of layers and said control logic form planes, said plane of said control logic being approximately parallel to said planes of the stack of layers and wherein said control logic is connected by conductor parts to control inputs of said active semiconductor switches, said conductor parts being arranged transverse to said planes of said stack of layers.

16. Power stage for driving an electric machine, specifically a brushless electric motor, in which said power stage comprises at least two semiconductor switches which are designed as semiconductor chips, said semiconductor switches being connected to each other by at least one bridge conductor thereby forming a half bridge, in which said semiconductor switches are area-contacting with one of their contact surfaces an electric conductor track, and in which said conductor tracks and at least one of said bridge conductors are connected to electric terminals for the machine and/or a power supply, wherein said at least one bridge conductor is area-contacting said semiconductor switches at a second contact surface which is disposed oppositely to said first contact surface connected with one of said conductor tracks, wherein at least one semiconductor switch is triggered by a control logic, said control logic comprising a semiconductor component into which a signal processing device is integrated, said semiconductor component being arranged in a plane that is parallel to said first contact surface of said active semiconductor switch, said semiconductor component is adjacent to said active semiconductor switch.

17. Power stage in accordance with claim 16, wherein a semiconductor component for triggering of at least one of said active semiconductor switches is integrated into said power stage, said semiconductor component being designed as Mixed-Signal-ASIC in flip-chip technology and being arranged on a multilayer thick film ceramic or a multilayer board.

18. Power stage for driving an electric machine, specifically a brushless electric motor, in which said power stage comprises at least two semiconductor switches which are designed as semiconductor chips, said semiconductor switches being connected to each other by at least one bridge conductor thereby forming a half bridge, in which said semiconductor switches are area-contacting with one of their contact surfaces an electric conductor track, and in which said conductor tracks and at least one of said bridge conductors are connected to electric terminals for the machine and/or a power supply, wherein said at least one bridge conductor is area-contacting said semiconductor switches at a second contact surface which is disposed oppositely to said first contact surface connected with one of said conductor tracks, wherein in a plane adjacent to at least one said semiconductor switches is arranged a polarity protection component and/or a current measuring shunt, said polarity protection component and said current measuring shunt being area-connected on their first contact surface to at least one of said conductor parts and on their oppositely disposed second contact surface to at least one input conductor or output conductor, said input conductor or output conductor being arranged approximately in a plane of said bridge conductor parallel to said first contact surface.

* * * * *